United States Patent
Critzer et al.

(10) Patent No.: US 9,253,883 B2
(45) Date of Patent: Feb. 2, 2016

(54) STRETCHABLE POLYMER THICK FILM SILVER CONDUCTOR FOR HIGHLY PERMEABLE SUBSTRATES

(71) Applicant: E I DU PONT DE NEMOURS AND COMPANY, Wilmington, DE (US)

(72) Inventors: Mark Steven Critzer, Morrisville, NC (US); Jay Robert Dorfman, Durham, NC (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 221 days.

(21) Appl. No.: 14/082,600

(22) Filed: Nov. 18, 2013

(65) Prior Publication Data

US 2015/0137048 A1    May 21, 2015

(51) Int. Cl.
| | | |
|---|---|---|
| *H01B 1/22* | (2006.01) | |
| *H05K 1/00* | (2006.01) | |
| *B05D 5/12* | (2006.01) | |
| *H05K 1/03* | (2006.01) | |
| *H01B 13/30* | (2006.01) | |
| *C09D 171/00* | (2006.01) | |
| *C09D 175/00* | (2006.01) | |

(52) U.S. Cl.
CPC *H05K 1/038* (2013.01); *B05D 5/12* (2013.01); *C09D 171/00* (2013.01); *C09D 175/00* (2013.01); *H01B 1/22* (2013.01); *H01B 13/30* (2013.01)

(58) Field of Classification Search
CPC .............. H01B 1/00; H01B 1/22; H01B 5/00; H01B 5/14; C09D 5/24; B05D 5/12; H05K 1/038; H05B 2203/036; H01H 2203/0085; A61B 5/6804
See application file for complete search history.

(56) References Cited

U.S. PATENT DOCUMENTS

| | | | |
|---|---|---|---|
| 5,089,173 A | 2/1992 | Frentzel | |
| 5,141,777 A | 8/1992 | Frentzel et al. | |
| 8,692,131 B2 * | 4/2014 | Dorfman | H01B 1/22 174/257 |
| 2009/0169724 A1 | 7/2009 | Ogiwara | |
| 2013/0068512 A1 * | 3/2013 | Dorfman | H01G 4/008 174/257 |
| 2013/0069016 A1 * | 3/2013 | Dorfman | H01B 1/22 252/514 |
| 2014/0154501 A1 * | 6/2014 | Dorfman | C08K 3/08 428/328 |

FOREIGN PATENT DOCUMENTS

| | | |
|---|---|---|
| EP | 0 527 156 A1 | 2/1993 |
| WO | 91/17550 A1 | 11/1991 |
| WO | 2013/043619 A1 | 3/2013 |

OTHER PUBLICATIONS

Han et al "Improved efficiency and stability of flexible dye sensitized solar cells . . . ", Photochem. Photobiol. Mar.-Apr. 2015; 91(2):315-22 (Abstract Only).*
Search Report mail Jun. 2, 2013.
International Search Report and Written Opinion (PCT/US2014/065425 Dated Mar. 23, 2105).
U.S. Appl. No. 13/236,959, filed Sep. 20, 2011, Dorfman.
U.S. Appl. No. 13/471,950, filed May 15, 2012, Dorfman et al.
U.S. Appl. No. 13/851,171, filed Mar. 27, 2013, Dorfman et al.
U.S. Appl. No. 14/050,525, filed Oct. 10, 2013, Dorfman et al.

* cited by examiner

*Primary Examiner* — Mark Kopec

(57) ABSTRACT

This invention is directed to a polymer thick film conductor composition. The polymer thick film (PTF) conductor composition may be used in applications where significant stretching is required, particularly on highly permeable substrates. A particular type of substrate which is suitable is a woven polyester coated with polyamide. An electrical circuit containing a conductor formed from the composition and a process to make such a circuit are provided.

10 Claims, No Drawings

STRETCHABLE POLYMER THICK FILM SILVER CONDUCTOR FOR HIGHLY PERMEABLE SUBSTRATES

FIELD OF THE INVENTION

This invention is directed to a polymer thick film (PTF) conductor composition that may be used in applications where significant stretching is required, particularly on highly permeable substrates. A particular type of substrate which is suitable is a woven polyester coated with polyamide.

BACKGROUND OF THE INVENTION

Conductive PTF circuits have long been used as electrical elements. Although they have been used for years in these types of applications, the use of PTF silver conductors in highly stretchable applications such as for wearable garments is not common. In such applications, the ability to be stretched and exposed to multiple wash/dry cycles and still maintain conductivity is critical. One permeable substrate used for this type of application is a woven polyester coated with polyamide, e.g., Cetus® OS5000U available from Dynic Corp. The silver PTF conductor composition must be compatible with this substrate. One of the purposes of this invention is to address these issues and produce a conductive, stretchable construction in which the printed silver conductor can be used on such a substrate.

SUMMARY OF THE INVENTION

This invention relates to a polymer thick film conductor composition comprising:
(a) 30 to 70 wt % silver flakes;
(b) 20 to 50 wt % first organic medium comprising 10 to 50 wt % thermoplastic urethane resin dissolved in a first organic solvent, wherein the weight percent (wt %) of the thermoplastic urethane resin is based on the total weight of the organic medium; and
(c) 5 to 20 wt % second organic medium comprising 10 to 50 wt % thermoplastic polyhydroxyether resin dissolved in a second organic solvent wherein the weight percent of the thermoplastic
(d) polyhydroxyether resin is based on the total weight of the organic medium;
wherein the ratio of the weight of the first organic medium to the weight of the second organic medium is about 3:1 and wherein the weight percent of the silver flakes, the first organic medium and the second organic medium are based on the total weight of the polymer thick film conductor composition.

The invention is further directed to using the highly stretchable conductive composition to form conductive electrical circuits on permeable substrates, in particular, for wearable garments.

Thus the invention provides an electrical circuit comprising a conductor formed from a polymer thick film conductor composition comprising:
(a) 30 to 70 wt % silver flakes;
(b) 20 to 50 wt % first organic medium comprising 10 to 50 wt % thermoplastic urethane resin dissolved in a first organic solvent, wherein the weight percent (wt %) of the thermoplastic urethane resin is based on the total weight of the organic medium; and
(c) 5 to 20 wt % second organic medium comprising 10 to 50 wt % thermoplastic polyhydroxyether resin dissolved in a second organic solvent wherein the weight percent of the thermoplastic polyhydroxyether resin is based on the total weight of the organic medium;
wherein the ratio of the weight of the first organic medium to the weight of the second organic medium is about 3:1, wherein the weight percent of the silver flakes, the first organic medium and the second organic medium are based on the total weight of the polymer thick film conductor composition and wherein the composition is dried to form the conductor on the permeable substrate.

The invention also provides a process for making an electrical circuit comprising a conductor formed from a thick film conductor composition, comprising the steps of:
(a) providing a permeable substrate;
(b) providing a polymer thick film conductor composition comprising:
  (i) 30 to 70 wt % silver flakes;
  (ii) 20 to 50 wt % first organic medium comprising 10 to 50 wt % thermoplastic urethane resin dissolved in a first organic solvent, wherein the weight percent (wt %) of the thermoplastic urethane resin is based on the total weight of the organic medium; and
  (iii) 5 to 20 wt % second organic medium comprising 10 to 50 wt % thermoplastic polyhydroxyether resin dissolved in a second organic solvent wherein the weight percent of the thermoplastic polyhydroxyether resin is based on the total weight of the organic medium;
wherein the ratio of the weight of the first organic medium to the weight of the second organic medium is about 3:1 and wherein the weight percent of the silver flakes, the first organic medium and the second organic medium are based on the total weight of the polymer thick film conductor composition;
(c) depositing said polymer thick film conductor composition onto said permeable substrate; and
(d) drying the polymer thick film conductor composition that was deposited in step (c) to form the conductor on the permeable substrate.

DETAILED DESCRIPTION OF INVENTION

The invention relates to a polymer thick conductor composition for use in electrical circuits and, in particular, highly stretchable deformed circuits. A layer of conductor is printed and dried on a substrate so as to produce a functioning circuit and then the entire circuit is subjected to the typical bending/creasing that a fabric would receive. Additionally, as is typical for fabrics, they must be washed/dried on a periodic basis and the conductivity of the conductor must be maintained.

The substrates commonly used in polymer thick film circuits are polyester (PET) and polycarbonate. However, those cannot be used here as they are not permeable. Permeable substrates like coated textiles, polyolefins, and paper can be used. It has been found that one particular substrate, a woven polyester coated with polyamide, e.g., Cetus® OS5000U available from Cynic Corp., produces excellent results.

The polymer thick film (PTF) conductor composition is comprised of (a) silver flakes, (b) a first organic medium comprising a first polymer resin dissolved in a first organic solvent and (c) a second organic medium containing a second polymer resin dissolved in a second organic solvent with the proviso that the ratio of the weight of the first medium to the weight of the second medium is about 3:1. Additionally, powders and printing aids may be added to improve the composition and additional solvent may be added to adjust the viscosity.

A. Conductive Powder

In an embodiment, the conductive powders in the present thick film composition are Ag conductor powders and may comprise Ag metal powder, alloys of Ag metal powder, or mixtures thereof. Various particle diameters and shapes of the metal powder are contemplated. In an embodiment, the conductive powder may include any shape silver powder, including spherical particles, flakes (rods, cones, plates), and mixtures thereof. In one embodiment, the conductive powder is composed of silver flakes.

In an embodiment, the particle size distribution of the conductive powders may be 1 to 100 microns; in a further embodiment, 2-10 microns.

In an embodiment, the surface area/weight ratio of the silver particles may be in the range of 0.1-1.0 $m^2/g$.

Furthermore, it is known that small amounts of other metals may be added to silver conductor compositions to improve the properties of the conductor. Some examples of such metals include: gold, silver, copper, nickel, aluminum, platinum, palladium, molybdenum, tungsten, tantalum, tin, indium, lanthanum, gadolinium, boron, ruthenium, cobalt, titanium, yttrium, europium, gallium, sulfur, zinc, silicon, magnesium, barium, cerium, strontium, lead, antimony, conductive carbon, and combinations thereof and others common in the art of thick film compositions. The additional metal(s) may comprise up to about 1.0 percent by weight of the total composition.

In one embodiment, the silver flakes are present at 30 to 70 wt % of the total weight of the composition. In another embodiment, the silver flakes are present at 45 to 55 wt % of the total weight of the composition B. Organic Medium The first organic medium is comprised of a thermoplastic urethane resin dissolved in a first organic solvent. The urethane resin must achieve good adhesion to the underlying substrate. It must be compatible with and not adversely affect the performance of the circuit after deformation and wash/dry cycles.

In one embodiment the thermoplastic urethane resin is 10-50 wt % of the total weight of the first organic medium. In another embodiment the thermoplastic urethane resin is 15-45 wt % of the total weight of the first organic medium and in still another embodiment the thermoplastic urethane resin is 15-28 wt % of the total weight of the first organic medium. In one embodiment the elastomeric urethane resin is a urethane homopolymer. The elastomeric urethane resin can be a linear hydroxyl polyurethane. In another embodiment the urethane resin is a polyester-based copolymer.

The second organic medium is comprised of a thermoplastic polyhydroxyether resin dissolved in a second organic solvent. It should be noted that the same solvent that is used in the first organic medium can be used in the second organic medium. However, a different solvent can also be used. In one embodiment the thermoplastic polyhydroxyether resin is 10-50 wt % of the total weight of the second organic medium. In another embodiment the thermoplastic polyhydroxyether resin is 15-45 wt % of the total weight of the organic medium and in still another embodiment the thermoplastic resin is 20-35 wt % of the total weight of the second organic medium.

The polymer resin is typically added to the organic solvent by mechanical mixing to form the medium. Solvents suitable for use in the polymer thick film composition are recognized by one of skill in the art and include acetates and terpenes such as carbitol acetate and alpha- or beta-terpineol or mixtures thereof with other solvents such as kerosene, dibutylphthalate, butyl carbitol, butyl carbitol acetate, hexylene glycol and high boiling alcohols and alcohol esters. In addition, volatile liquids for promoting rapid hardening after application on the substrate may be included. In many embodiments of the present invention, solvents such as glycol ethers, ketones, esters and other solvents of like boiling points, i.e., in the range of 180° C. to 250° C., and mixtures thereof may be used. Various combinations of these and other solvents are formulated to obtain the viscosity and volatility requirements desired. The solvents used must solubilize the resin.

When the silver flake content of the polymer thick film conductor composition is 30-70 wt %, there is 20-45 wt % first organic medium and 5-20 wt % second organic medium. When the silver flake content of the polymer thick film conductor composition is 45-55 wt %, there is 30-40 wt % first organic medium and 10-15 wt % second organic medium.

Ratio of First to Second Medium:

The ratio of the weight of the first (urethane-based) organic medium to the weight of the second (polyhydroxyether) organic medium is critical to the use of the polymer thick film conductor composition on permeable substrates. The optimum ratio is about 3:1, i.e., in the range of from 2.3 to 3.7. When the ratio is outside this range, the composition is less stable to the bending and wash/dry cycles which are critical for this composition and higher resistivity is observed.

Additional Powders

Various powders may be added to the PTF conductor composition to improve adhesion, modify the rheology and increase the low shear viscosity thereby improving the printability.

Application of the PTF Conductor Composition

The PTF conductor composition, also referred to as a "paste", is typically deposited on a substrate such as Cetus® OS5000U that is permeable to gases and moisture. The substrate can also be a sheet of a composite material made up of a combination of plastic sheet with a permeable coating deposited thereupon.

The deposition of the PTF conductor composition is performed typically by screen printing, but other deposition techniques such as stencil printing, syringe dispensing or coating techniques can be utilized. In the case of screen-printing, the screen mesh size controls the thickness of the deposited thick film.

Generally, a thick film composition comprises a functional phase that imparts appropriate electrically functional properties to the composition. The functional phase comprises electrically functional powders dispersed in an organic medium that acts as a carrier for the functional phase. Generally, the composition is fired to burn out both the polymer and the solvent of the organic medium and to impart the electrically functional properties. However, in the case of a polymer thick film, the polymer portion of the organic medium remains as an integral part of the composition after drying.

The deposited PTF conductor composition is processed for a time and at a temperature necessary to remove all solvent. For example, the deposited thick film is dried by exposure to heat at 140° C. for typically 10-15 min.

Circuit Construction

The base substrate used is typically polyamide-coated woven polyester, e.g., 108 micron thick Cetus® OS5000U. The conductor is printed and dried as per the conditions described above. Several layers can be printed and dried. A subsequent step which may include wash/dry cycles of the entire unit is typical in the production of these wearable/stretchable circuits.

EXAMPLE AND COMPARATIVE EXPERIMENTS

Example 1

The PTF conductor composition was prepared in the following manner. The first organic medium was prepared by mixing 20.0 wt % Desmocoll 540 flexible linear hydroxyl polyurethane (Bayer Material Science LLC, Pittsburgh, Pa.) with 80.0 wt % dibasic esters (DuPont Co., Wilmington, Del.) organic solvent. The molecular weight of the resin was approximately 20,000. This mixture was heated at 90° C. for 1-2 hours to dissolve all the resin. 34.50 wt % of the first organic medium was used in the composition. 47.00 wt % of a flake silver powder with an average particle size of approximately 5 microns was added to the first organic medium. A printing additive (0.25 wt %) was also added to this mixture. The second organic medium was prepared by mixing/heating as above 27.0 wt % of polyhydroxyether resin PKHH (Phenoxy Associates, Inc.) with 73.0 wt % dibasic esters. 12.75 wt % of the second organic medium was added to the mixture. 5.5 wt % dibasic esters was added to the mixture for thinning purposes. All wt % were based upon the total weight of the composition.

This composition was mixed for 30 minutes on a planetary mixer, and then subjected to several passes on a three roll-mill.

A circuit was then fabricated as follows. A pattern of a series of interdigitated silver lines was printed using a 280 mesh stainless steel screen onto a 108 micron thick Cetus® OS5000U (Dynic Corp.) substrate. The patterned lines were dried at 140° C. for 10 min. in a forced air box oven. A normalized resistivity of 15 mohm/sq/mil was observed.

Comparative Experiment A

A circuit was produced exactly as described in Example 1. The only difference was that the substrate used was 5 mil thick polyester. The calculated resistivity of the silver composition was 96 mohm/sq/mil.

Comparative Experiment B

A circuit was produced exactly as described in Example 1. The only difference was that the conductive composition used contained a reversed ratio of mediums. That is, the ratio of the weight of the first organic (urethane) medium to the weight of the second organic (polyhydroxyether) medium was 1:3. See the table below for performance data.

| Sample | Resistivity (mohm/sq/mil) |
|---|---|
| Example 1 | 15 |
| Comparative Experiment A | 96 |
| Comparative Experiment B | 50 |

The use of the urethane and polyhydroxyether resins in about a 3:1 ratio clearly shows good resistivity results as can be seen in Example 1. Use of a different substrate, i.e., polyester, rendered the composition less conductive (96 vs. 15 mohm/sq/mil) as can be seen in Comparative Experiment A. The criticality of the ratio of the two mediums can be seen in Comparative Experiment B where reversing the ratios has a profound negative effect on resistivity.

What is claimed is:

1. An electrical circuit on a wearable garment, the electrical circuit comprising:
   (i) a conductor formed from a polymer thick film conductor composition comprising:
      (a) 30 to 70 wt % silver flakes;
      (b) 20 to 50 wt % first organic medium comprising 10 to 50 wt % thermoplastic urethane resin dissolved in a first organic solvent, wherein the weight percent (wt %) of the thermoplastic urethane resin is based on the total weight of the
      (c) organic medium; and
      (d) 5 to 20 wt % second organic medium comprising 10 to 50 wt % thermoplastic polyhydroxyether resin dissolved in a second organic solvent wherein the weight percent of the thermoplastic polyhydroxyether resin is based on the total weight of the organic medium;
   wherein the ratio of the weight of the first organic medium to the weight of the second organic medium is in the range from 2.3 to 3.7, wherein the weight percent of the silver flakes, the first organic medium and the second organic medium are based on the total weight of the polymer thick film conductor composition; and
   (ii) a polyamide-coated woven polyester substrate, wherein the polymer thick film conductor composition is deposited on the polyamide-coated woven polyester substrate and is then dried to form the conductor on the polyamide-coated woven polyester substrate.

2. The electrical circuit of claim 1, wherein said thermoplastic urethane resin is a linear hydroxyl polyurethane.

3. The electrical circuit of claim 1, wherein said thermoplastic urethane resin is a polyester-based copolymer.

4. The electrical circuit of claim 1, wherein said permeable substrate is a woven polyester coated with polyamide.

5. The electrical circuit of claim 1, wherein said ratio of the weight of the first organic medium to the weight of the second organic medium is about 3:1.

6. A process for making an electrical circuit on a wearable garment, the electrical circuit comprising a conductor formed from a thick film conductor composition, said process comprising the steps of:
   (a) providing a polyamide-coated woven polyester substrate;
   (b) providing a polymer thick film conductor composition comprising:
      (i) 30 to 70 wt % silver flakes;
      (ii) 20 to 50 wt % first organic medium comprising 10 to 50 wt % thermoplastic urethane resin dissolved in a first organic solvent, wherein the weight percent (wt %) of the thermoplastic urethane resin is based on the total weight of the organic medium; and
      (iii) 5 to 20 wt % second organic medium comprising 10 to 50 wt % thermoplastic polyhydroxyether resin dissolved in a second organic solvent wherein the weight percent of the thermoplastic polyhydroxyether resin is based on the total weight of the organic medium;
   wherein the ratio of the weight of the first organic medium to the weight of the second organic medium is in the range from 2.3 to 3.7 and wherein the weight percent of the silver flakes, the first organic medium and the second organic medium are based on the total weight of the polymer thick film conductor composition;
   (c) depositing said polymer thick film conductor composition onto said polyamide-coated woven polyester; and (d) drying the polymer thick film conductor composition that was deposited in step (c) to form the conductor on the polyamide-coated woven polyester substrate.

7. The process of claim 6, wherein said thermoplastic urethane resin is a linear hydroxyl polyurethane.

8. The process of claim 6, wherein said thermoplastic urethane resin is a polyester-based copolymer.

9. The process of claim 6, wherein said permeable substrate is a woven polyester coated with polyamide.

10. The process of claim 6, wherein said ratio of the weight of the first organic medium to the weight of the second organic medium is about 3:1.

* * * * *

UNITED STATES PATENT AND TRADEMARK OFFICE
CERTIFICATE OF CORRECTION

PATENT NO. : 9,253,883 B2
APPLICATION NO. : 14/082600
DATED : February 2, 2016
INVENTOR(S) : Mark Steven Critzer et al.

Page 1 of 1

It is certified that error appears in the above-identified patent and that said Letters Patent is hereby corrected as shown below:

In claim 1:

Col. 6, line 12, delete "(c)'"; therefore, line reads --organic medium; and--.

Col. 6, line 13, delete "(d)" and replace with "(c)".

Signed and Sealed this
Tenth Day of May, 2016

Michelle K. Lee
*Director of the United States Patent and Trademark Office*